United States Patent
Yang et al.

(10) Patent No.: US 7,514,981 B2
(45) Date of Patent: Apr. 7, 2009

(54) MIXER CIRCUIT

(75) Inventors: Chao-Tung Yang, Hsinchu (TW); Shuo-Yuan Hsiao, Hsinchu (TW)

(73) Assignee: Mstar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 11/762,500

(22) Filed: Jun. 13, 2007

(65) Prior Publication Data

US 2008/0180156 A1    Jul. 31, 2008

(30) Foreign Application Priority Data

Jan. 30, 2007    (TW) .............................. 96103416 A

(51) Int. Cl.
*H03D 7/12* (2006.01)
(52) U.S. Cl. .................. 327/359; 327/355; 455/333
(58) Field of Classification Search ......... 327/355–359; 455/326, 333
See application file for complete search history.

(56) References Cited

U.S. PATENT DOCUMENTS

| | | | | |
|---|---|---|---|---|
| 7,218,163 | B2* | 5/2007 | Hanke et al. ................. | 327/358 |
| 7,308,244 | B2* | 12/2007 | Chang et al. ................. | 455/326 |
| 2004/0174199 | A1* | 9/2004 | Simon ......................... | 327/256 |

OTHER PUBLICATIONS

Brenna, G., Tschopp, D., Rogin, J., Kouchev, I., and Huang, Q., "A 2-GHz Carrier Leakage Calibrated Direct-Conversion WCDMA Transmitter in 0.13-um CMOS", IEEE Journal of Solid-State Circuits, Aug. 2004, pp. 1253-1262, vol. 39-No. 8.

Palaskas, Y., Taylor, S., Pellerano, S., Rippke, I., Bishop, R., Ravi, A., Lakdawala, H., and Soumyanath, K., "A 5-GHz 20-dBm Power Amplifier With Digitally Assisted AM-PM Correction in a 90-nm CMOS Process", IEEE Journal of Solid-State Circuits, Aug. 2006, pp. 1757-1763, vol. 41-No. 8.

Vassiliou, I., Vavelidis, K., Georgantas, T., Plevridis, S., Haralabidis, N., Kamoulakos, G., Kapnistis, C., Kavadias, S., Kokolakis, Y., Merakos, P., Rudell, J., Yamanaka, A., and Bouras, S., Bouras, I., "A Single-Chip Digitally Calibrated 5.15-5.825-GHz 0.18um CMOS Transceiver for 802.11a Wireless LAN", IEEE Journal of Solid-State Circuits, Dec. 2003, pp. 2221-2231, vol. 38-No. 12.

(Continued)

*Primary Examiner*—Dinh T. Le

(57) ABSTRACT

A mixer in a smaller signal differential model includes a load circuit, a switch quad, and a transconductor. The switch quad further including a first current path and a second current path is coupled to the load circuit. The connecting node of the switch quad and the load circuit is a differential-output terminal. The transconductor further includes a first resistor, a first operational amplifier, a second operational amplifier, a first current mirror, and a second current mirror. The resistor is coupled between two first input terminals of the first operational amplifier and the second operational amplifier. A current control terminal of the first current mirror is coupled to the first input terminal of the first operational amplifier, and a current mirroring terminal of the first current mirror is coupled to the first current path. A current control terminal of the second current mirror is coupled to the first input terminal of the second operational amplifier, and a current mirroring terminal of the second current mirror is coupled to the second current path. A differential voltage is applied between two second input terminals of the first operational amplifier and the second operational amplifier.

9 Claims, 14 Drawing Sheets

OTHER PUBLICATIONS

Kaczman, D., Shah, M., Godambe, N., Alam, M., Guimaraes, H., Han, L., Rachedine, M., Cashen, D., Getka, W., Dozier, C., Shepard, W., and Couglar, K., "A Single-Chip Tri-Band (2100, 1900, 850/800 MHz WCDMA/HSDPA Cellular Transceiver", IEEE Journal of Solid-State Circuits, May 2006, pp. 1122-1132, vol. 41-No. 5.

Song, E., Koo, Y., Jung, Y., Lee, D., Chu, S., and CHAE, S., "A 0.25-m CMOS Quad-Band GSM RF Transceiver Using an Efficient LO Frequency Plan", IEEE Journal of Solid-State Circuits, May 2005, pp. 1094-1106; Vo. 40-No. 5.u.

* cited by examiner

MIXER CIRCUIT

FIELD OF THE INVENTION

The present invention relates to a mixer circuit, and more particularly to a mixer circuit having a transconductor with a linear voltage-current transfer function.

BACKGROUND OF THE INVENTION

Generally, the mixer is a frequency conversion element used in a radio transceiver. FIG. 1 depicts a block diagram of a conventional mixer. Basically, a mixer comprises a transconductor 10, a switch quad 20, and a load circuit 30. The load circuit 30 comprises a first load (l1) and a second load (l2). Each of the first load (l1) and the second load (l2) has a first terminal to which a voltage source (Vcc) is applied, and a second terminal serving as an output terminal (Out).

The switch quad 20 comprises four n-channel transistors Mn13, Mn14, Mn15, and Mn16. The drains of the transistors Mn13, Mn15 are coupled to the second terminal of the first load (l1), and the drains of the n-channel transistors Mn14, Mn16 are coupled to the second terminal of the second load (l2). Moreover, the gates of the n-channel transistors Mn13, Mn16 are coupled to each other, and the gates of the n-channel transistors Mn14, Mn15 are coupled to each other. An LO signal (Local Oscillator Signal) is applied to the gates of the n-channel transistors Mn13 and Mn14. Moreover, the sources of the n-channel transistors Mn13 and Mn14 are coupled to each other to provide a first current path of the switch quad 20. The sources of the n-channel transistors Mn15 and Mn16 are coupled to each other to provide a second current path of the switch quad 20.

The transconductor 10 comprises two n-channel transistors Mn17 and Mn18. The drain of the n-channel transistor Mn17 is coupled to the first current path of the switch quad 20, and the drain of the n-channel transistor Mn18 is coupled to the second current path of the switch quad 20. Voltage signals Vin$^+$ and Vin$^-$ are applied to the gates of the n-channel transistors Mn17 and Mn18, respectively. Moreover, the sources of the n-channel transistors Mn17 and Mn18 are coupled to the drain of the n-channel transistor Mn19. The source of the n-channel transistor Mn19 is grounded. The n-channel transistor Mn19 serves as a constant current source due to the gate of the n-channel transistors Mn19 being applied thereto a fixed DC voltage.

FIG. 2 is a timing diagram showing the input/output signals of the conventional mixer. In a small signal differential model, the input voltage signal (Vin=Vin$^+$–Vin$^-$) is converted to a current signal (Iin) by the transconductor 10. When the current signal (Iin) is flowing through the first current path and the second current path of the switch quad 20, the current signal (Iin) is converted to a frequency converted current signal by the driving of the LO signal. Then, the frequency converted current signal is converted to a voltage signal by the load circuit 30 and the voltage signal is outputted from the output terminal (Out).

FIG. 3 is a diagram showing a typical voltage-current transfer function of the transconductor in the conventional mixer. As depicted in FIG. 3, the voltage to current transfer function is not linear, but quadratic. Because of the non-linear characteristic of the n-channel transistors Mn17 and Mn18, the transfer function between the voltage and the current in the transconductor 10 is non-linear. The conventional mixer suffers from the non-linear characteristic of the transconductor 10, which prohibits this type of mixer in the high linearity application such as wireless local area network (WLAN) or code division multiple access (CDMA) transmitters.

There are several conventional mixers employing transconductors with linear transfer functions. FIG. 4 depicts a mixer, disclosed in IEEE Journal of Solid-State Circuits. Vol. 40, No. 5, May 2005, having a transconductor with a linear voltage-current transfer function. The following description focuses on the circuit design of the transconductor.

As depicted in FIG. 4, the transconductor 40 comprises two n-channel transistors Mn20 and Mn21, two operational amplifiers OP3 and OP4, a resistor R4, and two current sources I4th and I5th. The drains of the n-channel transistors Mn20 and Mn21 are coupled to the first current path and the second current path of the switch quad, respectively. The output terminal of the operational amplifier OP3 is coupled to the game of the n-channel transistor Mn20, and the negative input terminal of the operational amplifier OP3 is coupled to the source of the n-channel transistor Mn20. The output terminal of the operational amplifier OP4 is coupled to the gate of the n-channel transistor Mn21, and the negative input terminal of the operational amplifier OP4 is coupled to the source of the n-channel transistor Mn21. The input voltage signals Vin$^+$ and Vin$^-$ are applied to the positive input terminals of the operational amplifiers OP3 and OP4, respectively. Moreover, the current source I4th is coupled between the source of the n-channel transistor Mn20 and the ground. The current source I5th is coupled between the source of the n-channel transistor Mn21 and the ground. The resistor R4 is coupled between the source of the n-channel transistor Mn20 and the source of the n-channel transistor Mn21.

In the operational amplifier OP3, due to its high open loop gain, the voltage of the positive input terminal is equal to the voltage of the negative input terminal. Similarly, the voltage of the positive input terminal is equal to the voltage of the negative input terminal in the operational amplifier OP4. Therefore, in the small signal model, the current Iin is given by the equation Iin=(Vin$^+$–Vin$^-$)/R4. The linear voltage-current transfer function can be achieved in the transconductor 40 shown in FIG. 4.

FIG. 5 depicts a mixer, which is disclosed in IEEE Journal of Solid-State Circuits, Vol. 38, No. 12, December 2003, having a transconductor with a linear voltage-current transfer function. The transconductor 50 comprises two p-channel transistors Mp1 and Mp2, two operational amplifiers OP5 and OP6, a resistor R5, and four current sources I6th, I7th, I8th, and I9th. The drains of the p-channel transistors Mp1 and Mp2 are coupled to the first current path and the second current path of the switch quad, respectively. The output terminal of the operational amplifier OP5 is coupled to the gate of the p-channel transistor Mp1, and the negative input terminal of the operational amplifier OP5 is coupled to the source of the p-channel transistor Mp1. The output terminal of the operational amplifier OP6 is coupled to the gate of the p-channel transistor Mp2, and the negative input terminal of the operational amplifier OP6 is coupled to the source of the p-channel transistor Mp2. The voltage signals Vin$^+$ and Vin$^-$ are applied to the positive input terminals of the operational amplifiers OP5 and OP6, respectively. Moreover, the current source I6th is coupled between the source of the p-channel transistor Mp1 and the voltage source (Vcc), the current source I7th is coupled between the source of the of the p-channel transistor Mp2 and the voltage source (Vcc), the current source I8th is coupled between the drain of the p-channel transistor Mp1 and the ground, and the current source I9th is coupled between the drain of the p-channel transistor Mp2 and the ground. The resistor R5 is coupled between the sources of the p-channel transistor Mp1 and the p-channel transistor Mp2.

Similarly, in the operational amplifier OP5, due to its high open loop gain, the voltage of the positive input terminal is equal to the voltage of the negative input terminal, so that the voltage of the positive input terminal is equal to the voltage of the negative input terminal in the operational amplifier OP6. Therefore, the current Iin is given by the equation Iin=(Vin$^+$−Vin$^-$)/R5 in the small model. The linear voltage-current transfer function can be achieved in the transconductor 50 shown in FIG. 5.

FIG. 6 depicts a mixer, disclosed in IEEE Journal of Solid-State Circuits, Vol. 39, No. 8, August 2004, having a transconductor with a linear voltage-current transfer function. The transconductor 60 comprises two n-channel transistors Mn22 and Mn23, a differential operational amplifier 63, two resistors R6 and R7, a compensating circuit 64 and a compensating circuit 66. The drains of the n-channel transistors Mn22 and Mn23 are coupled to the first current path and the second current path of the switch quad, respectively. The first output terminal of the differential operational amplifier 63 is coupled to the gate of the n-channel transistor Mn22, and the negative input terminal of the differential operational amplifier 63 is coupled to the source of the n-channel transistor Mn22. The second output terminal of the differential operational amplifier 63 is coupled to the gate of the n-channel transistor Mn23, and the positive input terminal of the differential operational amplifier 63 is coupled to the source of the n-channel transistor Mn23. The compensating circuit 64 is coupled between the first output terminal of the differential operational amplifier 63 and the ground, and the compensating circuit 66 is coupled between the second output terminal of the differential operational amplifier 63 and the ground, wherein both the compensating circuit 64 and the compensating circuit 66 comprise a capacitor and a resistor coupled in series. The first terminal of the resistor R6 is coupled to the negative input terminal of the differential operational amplifier 63, and the first terminal of the resistor R7 is coupled to the positive input terminal of the differential operational amplifier 63. The voltage signals Vin$^+$ and Vin$^-$ are applied to the second terminal of the resistor R6 and the second terminal of the resistor R7, respectively.

In view of the differential operational amplifier 63, due to its high open loop gain, the voltage of the positive input terminal is equal to the voltage of the negative input terminal. Therefore, the current Iin is given by the equation Iin=(Vin$^+$−Vin$^-$)/(R6+R7) in the small signal differential model. The linear voltage-current transfer function can be achieved in the transconductor 60 shown in FIG. 6.

FIG. 7 depicts a mixer, which is disclosed in IEEE Journal of Solid-State Circuits, Vol. 41, No. 8, August 2006, having a transductor with a linear voltage-current transfer function. The transconductor 70 comprises four n-channel transistors Mn24, Mn25, Mn26, and Mn27, four current sources I10th, I11th, I12th, and I13th, a resistor R8, and two p-channel transistors Mp3 and Mp4. The drains of the n-channel transistors Mn24 and Mn25 are coupled to the first current path and the second current path of the switch quad, respectively. The current source I12th is coupled between the source and the gate of the n-channel transistor Mn24, and also coupled between the source and the gate of the n-channel transistor Mn26. The current source I13th is coupled between the source and the gate of the n-channel transistor Mn25, and also coupled between the source and the gate of the n-channel transistor Mn27. The drain of the p-channel transistor Mp3 is coupled to the gate of the n-channel transistor Mn26, and the source of the p-channel transistor Mp3 is coupled to the drain of the n-channel transistor Mn26. The drain of the p-channel transistor Mp4 is coupled to the gate of the n-channel transistor Mn27, and the source of the p-channel transistor Mp4 is coupled to the drain of the n-channel transistor Mn27. The resistor R8 is coupled between the source of the p-channel transistor Mp3 and the source of the p-channel transistor Mp4. The current source I10th is coupled between the source of the p-channel transistor Mp3 and the voltage source (Vcc), and the current source I11th is coupled between the source of the p-channel transistor Mp4 and the voltage source (Vcc).

In view of the p-channel transistors Mp3 and Mp4, the voltage of the gate is equal to the voltage of the source due to each transistor being connected as a super source follower. Therefore, the current I' is given by the equation I'=(Vin$^+$−Vin$^-$)/R8 in the small signal model. The current Iin is given by the equation Iin=NI'=N(Vin$^+$−Vin$^-$)/R8 if the aspect ratio of Mn24 to Mn26 is N:1 and the aspect ratio of Mn25 to Mn27 is N:1. The linear voltage-current transfer function can be achieved in the transconductor 70 shown in FIG. 7.

FIG. 8 depicts a mixer, which is disclosed in IEEE Journal of Solid-State Circuits, Vol. 41, No. 5, May 2006, having a conductor with a linear voltage-current transfer function. The transconductor 80 comprises four n-channel transistors Mn5, Mn6, Mn7, and Mn8, a buffer 87, and two resistors R9 and R10. The drains of the n-channel transistors Mn5 and Mn6 are coupled to the first current path and the second current path of the switch quad, respectively. The sources of the n-channel transistors Mn5, Mn6, Mn7, and Mn8 are grounded. The gate and the drain of the n-channel transistor Mn7 are coupled together, the gate of the n-channel transistor Mn5 and the gate of the n-channel transistor Mn7 are coupled together, and thus the n-channel transistors Mn5 and Mn7 function as a current mirror. The gate and the drain of the n-channel transistor Mn8 are coupled together, the gate of the n-channel transistor Mn6 and the gate of the n-channel transistor Mn8 are coupled together, and thus the n-channel transistors Mn6 and Mn8 form a current mirror. The resistor R9 is coupled between the drain of the n-channel transistor Mn7 and a voltage source (Vcc), and the resistor R10 is coupled between the drain of the n-channel transistor Mn8 and the voltage source (Vcc). The voltage signals Vin$^+$ and Vin$^-$ are applied to the two input terminals of the buffer 87, and the two output terminals of the buffer 87 are coupled to the gates of the n-channel transistors Mn7 and Mn8, respectively.

In the small signal model, the current I' is given by the equation I'=(Vin$^+$−Vin$^-$)/(R9+R10). Also, the current Iin is given by the equation Iin=NI'=N (Vin$^+$−Vin$^-$)/(R9+R10) if the aspect ratio of Mn5 to Mn 7 is N:1 and the aspect ratio of Mn6 to M8 is N:1. The linear voltage-current transfer function can be achieved in the transconductor 80 shown in FIG. 8.

To achieve the transconductor with a linear voltage-current transfer function, the transconductors in the mixers shown in FIGS. 4, 5, and 6 utilize negative feedback at the source terminals of the transistors. The purpose of the present invention provides a novel mixer having a linear voltage-current transfer function.

SUMMARY OF THE INVENTION

Therefore, the object of the present invention is to provide a transconductor in a mixer with a liner voltage-current transfer function.

The present invention discloses a mixer in a small signal differential model, which comprises: a load circuit; a switch quad coupled to the load circuit, and having a first current path and a second current path, wherein a connecting node between the switch quad and the load circuit is defined as an output terminal; and a transconductor having a first resistor, a first operational amplifier, a second operational amplifier, a first current mirror, and a second current mirror, wherein the first resistor is coupled between a first input terminal of the first operational amplifier and a first input terminal of the second operational amplifier, a current control terminal of the first current mirror is coupled to the first input terminal of the first operational amplifier, a current mirroring terminal of the first current mirror is coupled to the first current path, a current control terminal of the second current mirror is coupled to the first input terminal of the second operational amplifier, a current mirroring terminal of the second current mirror is coupled to the second current path, and a second input terminal of the first operational amplifier and a second input terminal of the second operational amplifier can receive a voltage signal.

BRIEF DESCRIPTION OF THE DRAWINGS

The present invention will become readily apparent to those ordinarily skilled in the art after reviewing the following detailed description and accompanying drawings, in which.

DETAILED DESCRIPTION OF THE PREFERRED EMBODIMENT

Figure 1:
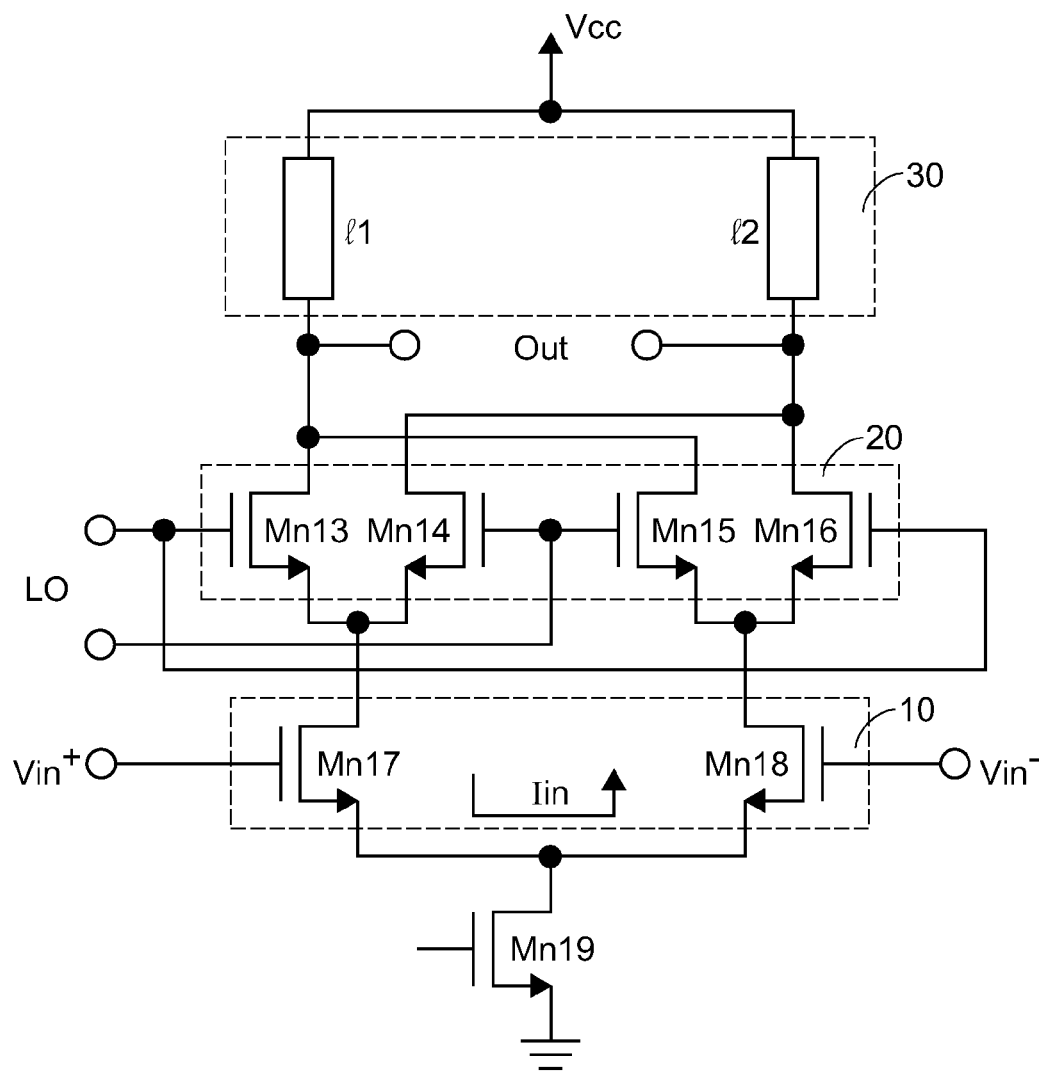
FIG. 1 depicts a block diagram of a conventional mixer.
Figure 2:
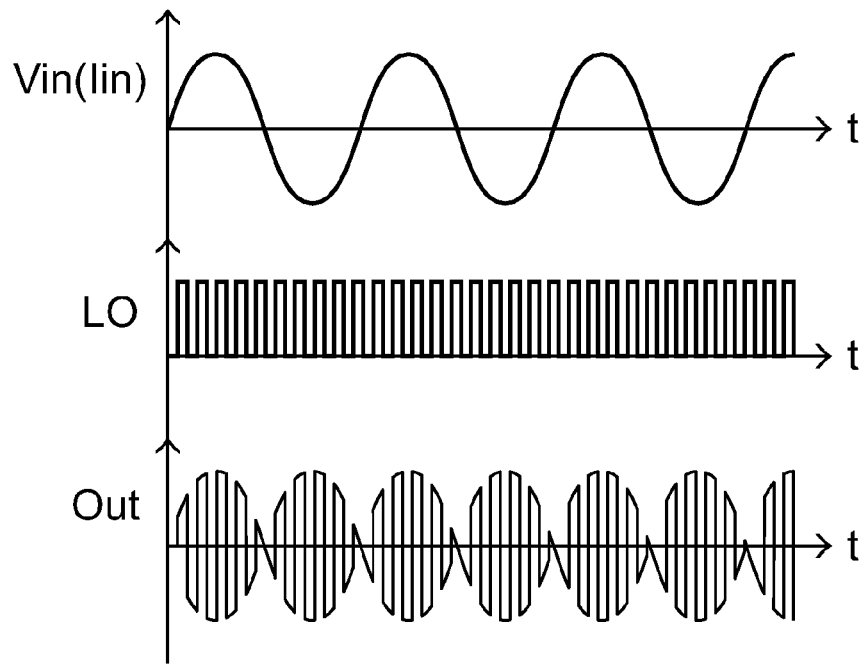
FIG. 2 is a timing diagram showing the input signal (Vin) and the output signal (Out) of the conventional mixer.
Figure 3:
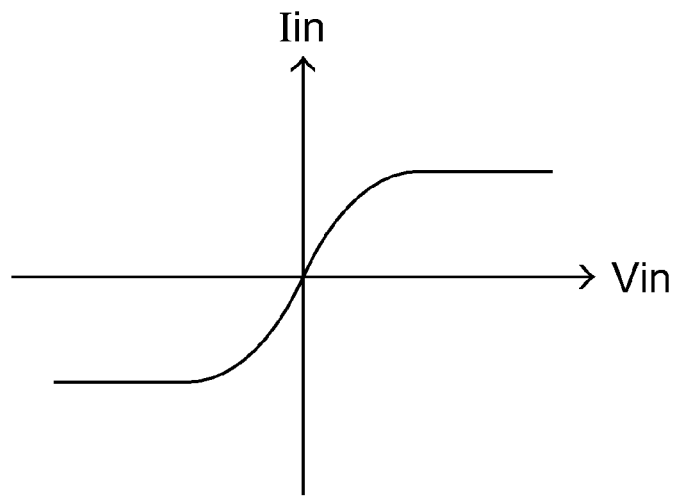
FIG. 3 is a diagram showing a voltage-current transfer function of a transconductor in the conventional mixer.
Figure 4:
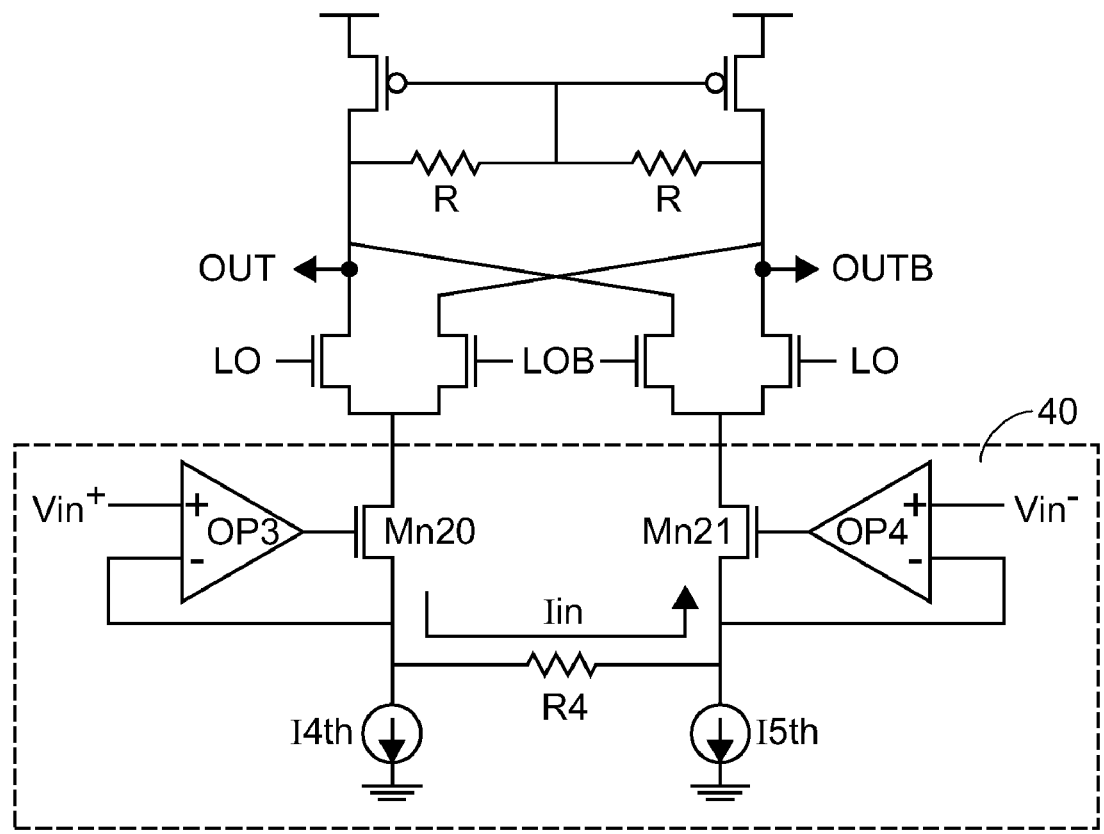
FIGS. 4, 5, 6, 7 and 8 depict mixers according to the prior art.
Figure 5:
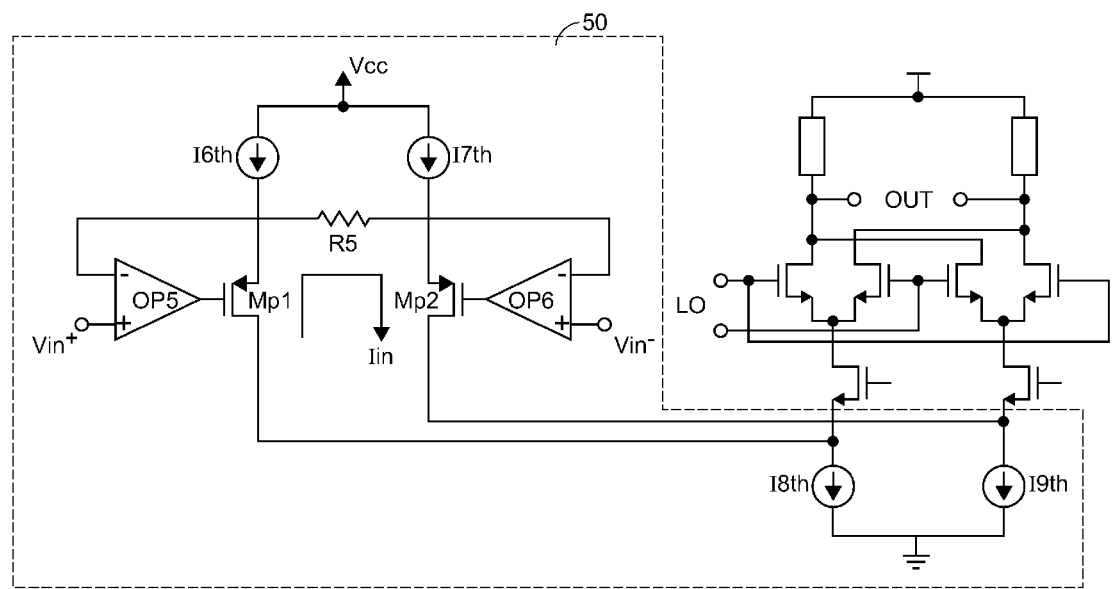
Figure 6:
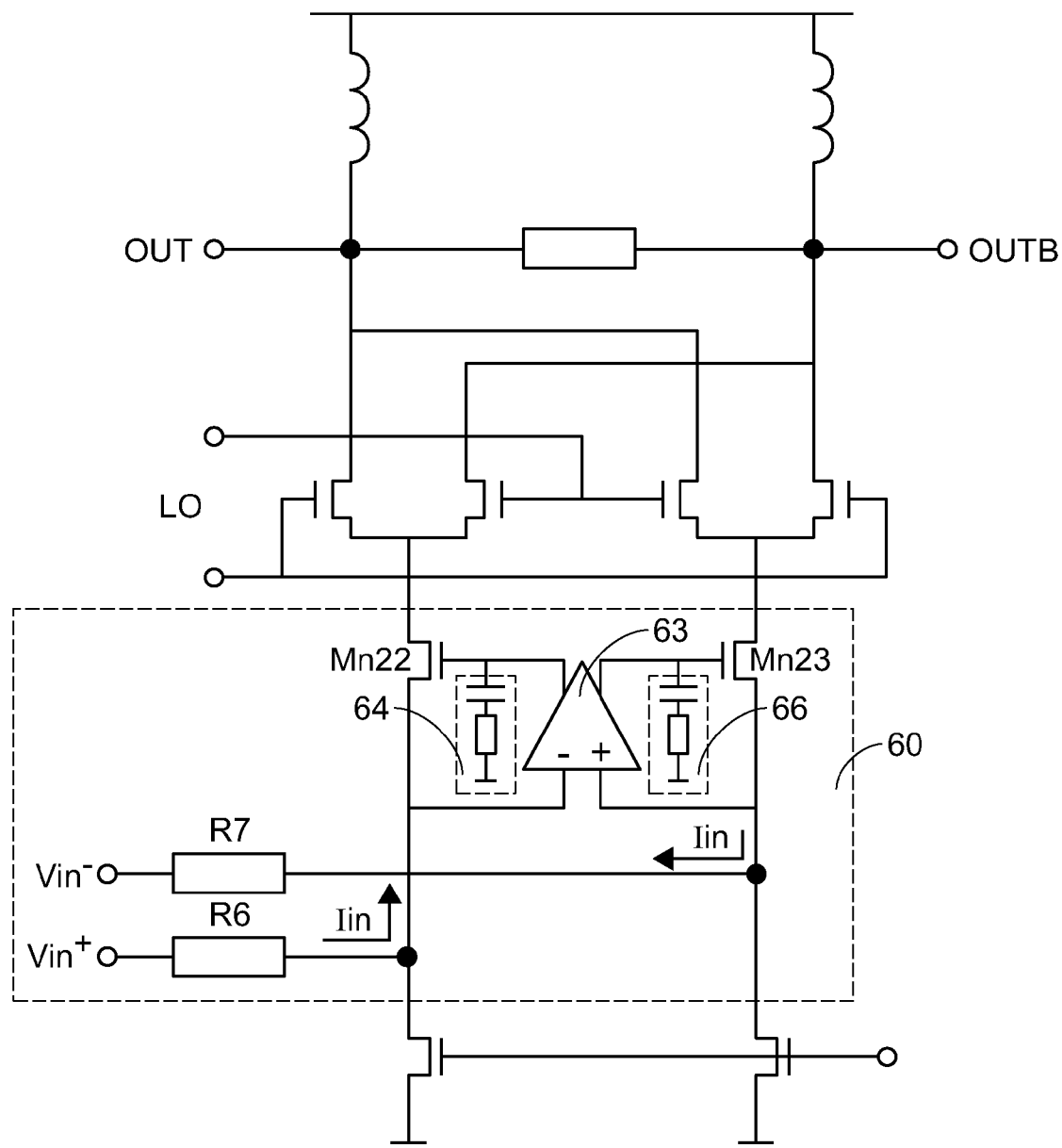
Figure 7:
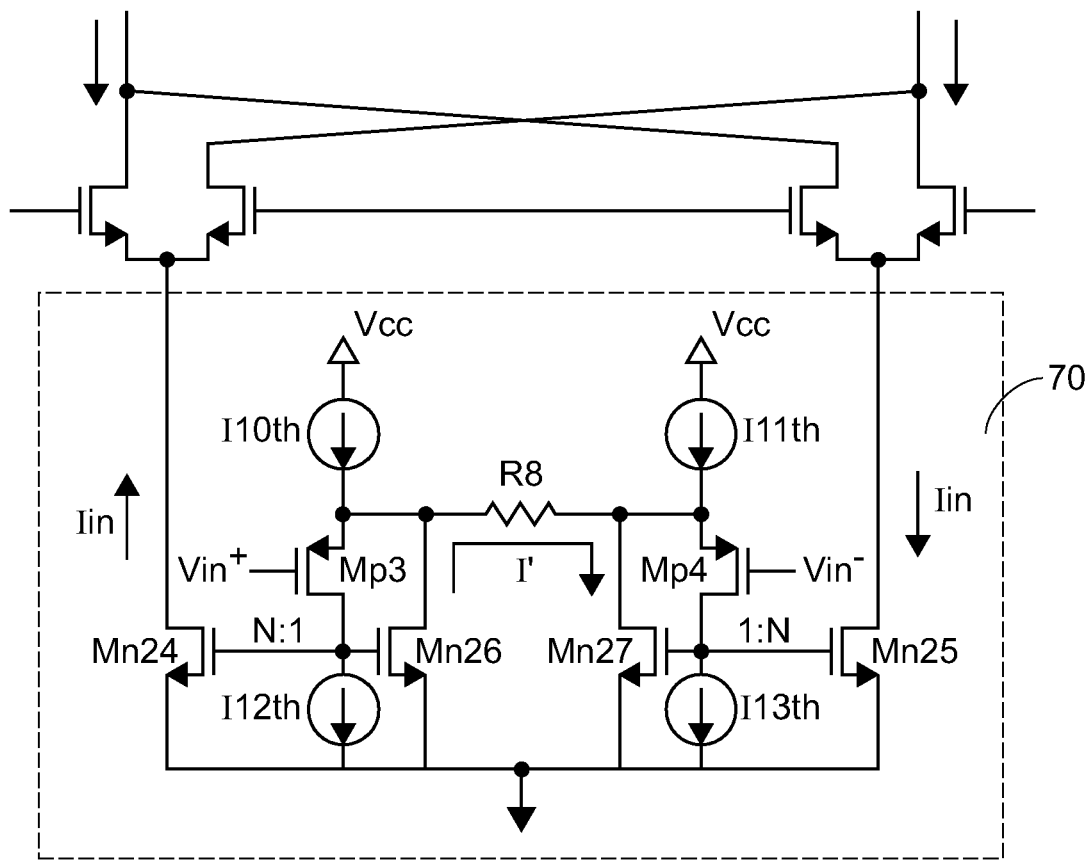
Figure 8:
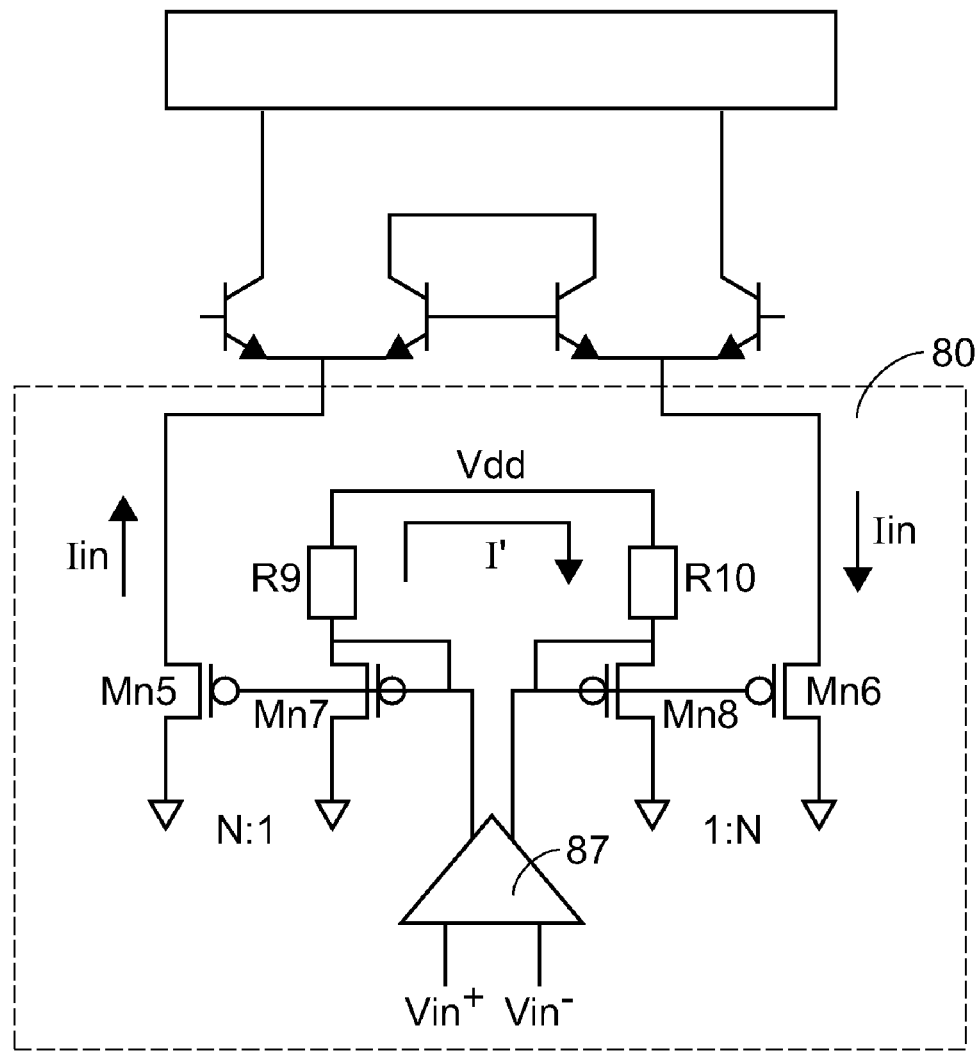
Figure 9:
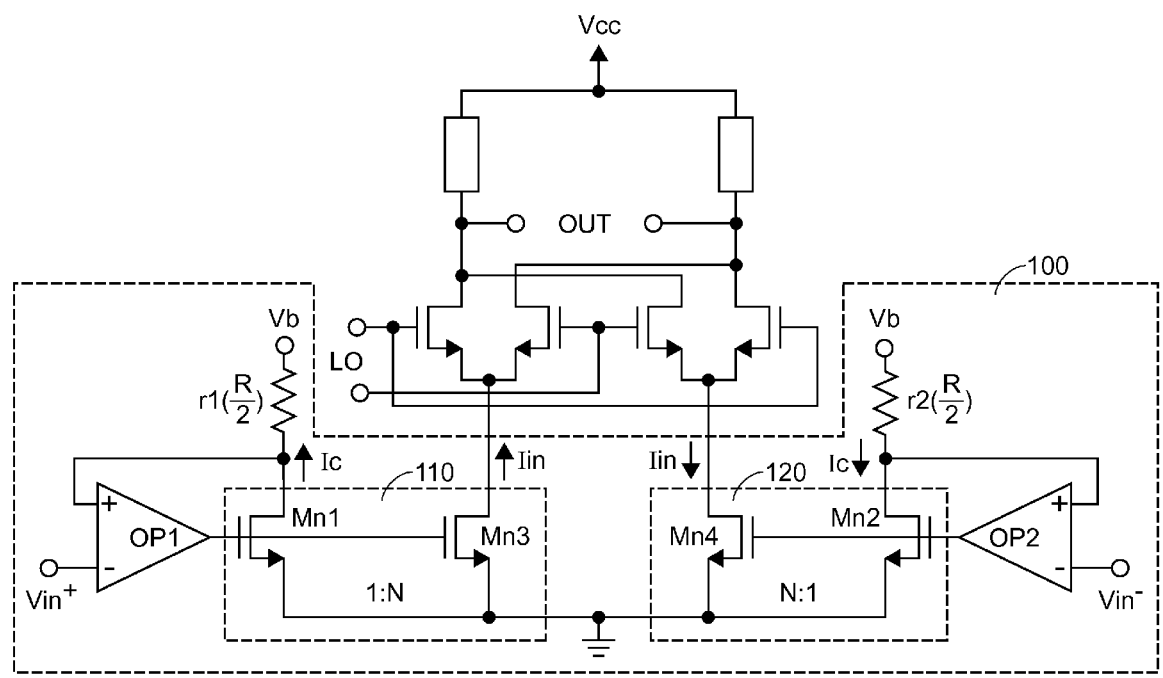
FIG. 9 is a mixer according to the first embodiment of the present invention.

FIG. 9 depicts a mixer according to the first embodiment of the present invention. The main difference between the mixer shown in FIG. 9 and the conventional mixer shown in FIG. 1 is the circuit design of the transconductor, and therefore, the following description will be focused on the circuit design of the transconductor.

The transductor 100 comprises four n-channel transistors Mn1, Mn2, Mn3, and Mn4, two operational amplifiers OP1 and OP2, and two resistors r1 and r2, each having a resistance of R/2. The aspect ratio of Mn3 to Mn1 to N:1 and the aspect ratio of Mn4 to Mn2 is N:1.

The resistor r1 is coupled between a positive input terminal of the operational amplifier OP1 and a DC voltage source (Vb), and the resistor r2 is coupled between a positive input terminal of the operational amplifier OP2 and the DC voltage source (Vb). The gates of the n-channel transistors Mn1 and Mn3 are coupled to each other and the n-channel transistors Mn1 and Mn3 operate as a current mirror 110. The drain of the n-channel transistor Mn1 serves as a current control terminal of the current mirror 110, and the drain of the n-channel transistor Mn3 serves as a current mirroring terminal of the current mirror 110, which is coupled to the first current path of the switch quad. The sources of the n-channel transistors Mn1 and Mn3 are coupled to the ground. The gates of the n-channel transistors Mn2 and Mn4 are coupled to each other and the n-channel transistors Mn2 and Mn4 operate as a current mirror 120. The drain of the n-channel transistor Mn2 serves as a current control terminal of the current mirror 120, and the drain of the n-channel transistor Mn4 serves as a current mirroring terminal of the current mirror 120, which is coupled to the second current path of the switch quad. The sources of the n-channel transistors Mn2 and Mn4 are grounded. Moreover, the output terminal of the operational amplifier OP1 is coupled to the gate of the n-channel transistor Mn1, and the output terminal of the operational amplifier OP2 is coupled to the gate of the n-channel transistor Mn2. The voltage signals $Vin^+$ and $Vin^-$ are applied to the negative input terminals of the operational amplifiers OP1 and OP2, respectively.

Figure 10:
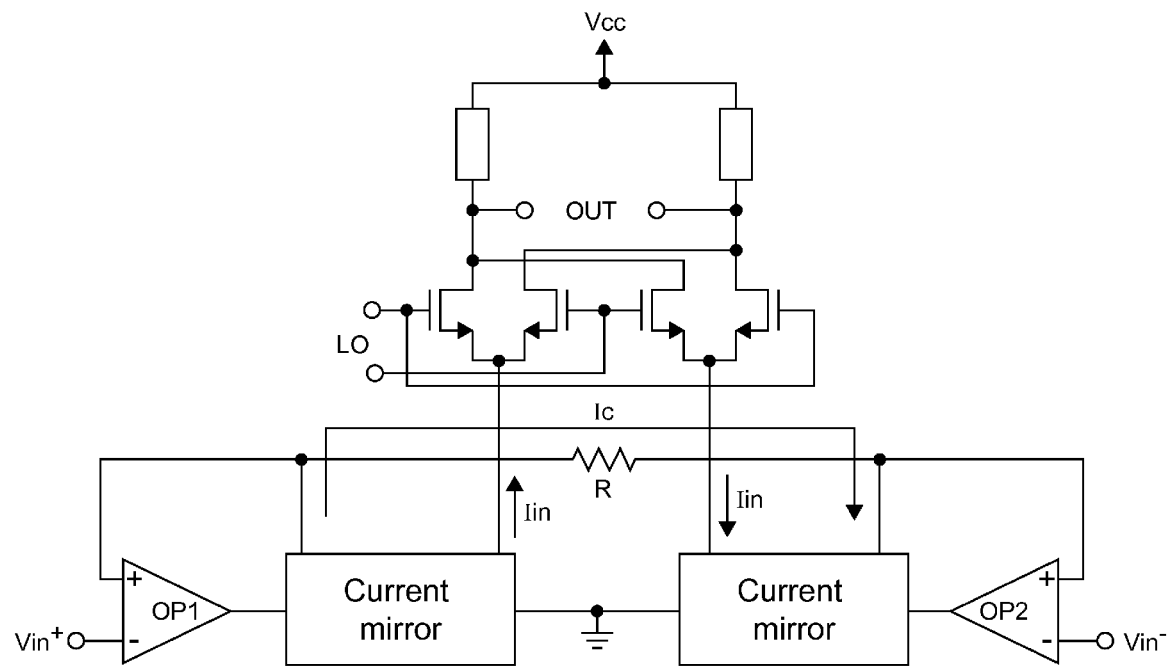
FIG. 10 is an equivalent circuit of the first embodiment in a small signal differential model.

FIG. 10 depicts an equivalent circuit of the first embodiment in the small signal differential model. The resistors r1 and r2 are coupled in series (R/2+R/2=R) between the positive terminal of the operational amplifier OP1 and the positive terminal of the operational amplifier OP2. Therefore, the current Ic flowing through the current control terminals of the two current mirrors is given by the equation $Ic=(Vin^+-Vin^-)/R$. Also, the current Iin flowing through the current mirroring terminals of the two current mirrors is given by the equation $Iin=N*(Vin^+-Vin^-)/R$. The linear voltage-current transfer function is achieved by the transconductor 100 of the first embodiment.

Figure 11:
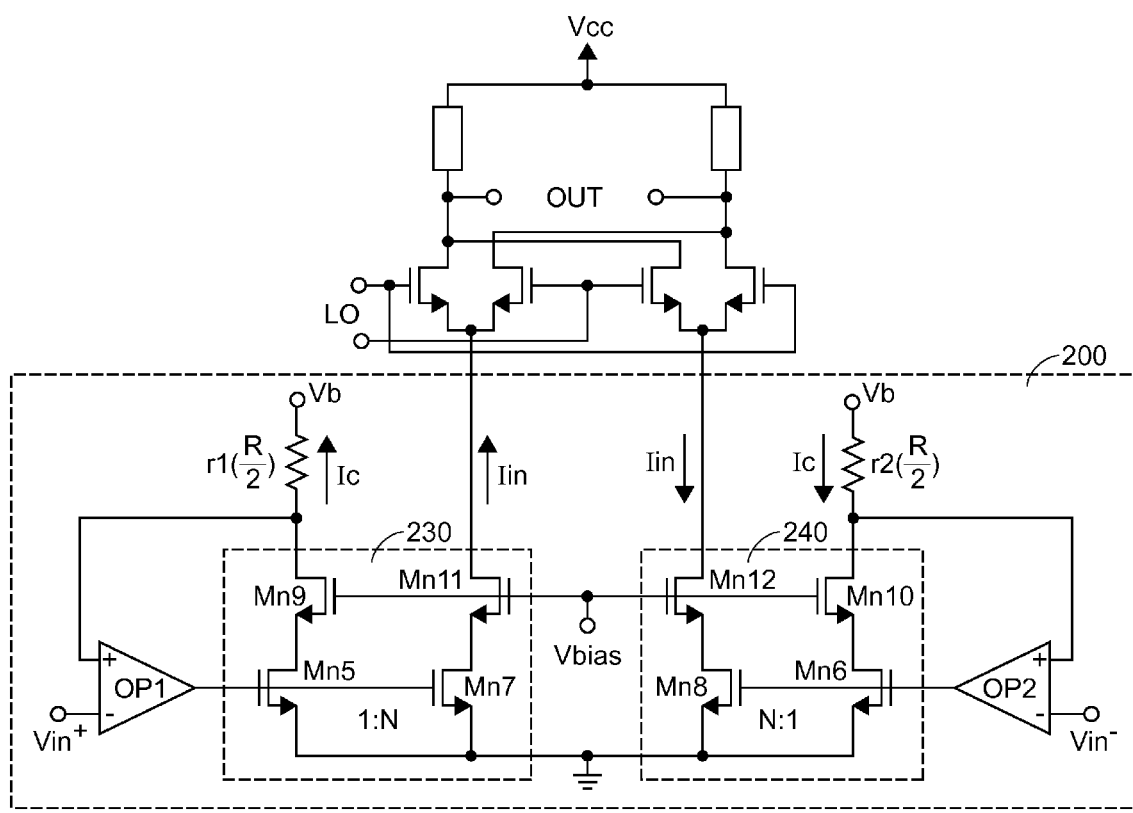
FIG. 11 is a mixer according to the second embodiment of the present invention.

FIG. 11 depicts a mixer according to the second embodiment of the present invention. The main difference between the second embodiment and the first embodiment is the circuitry of the current mirror. In FIG. 11, each of the current mirrors 230 and 240 comprises cascade transistors. These cascade transistors provide more precise currents to the current control terminals and the current mirroring terminals of the current mirrors 230 and 240.

The current mirror 230 comprises four n-channel transistors Mn5, Mn7, Mn9, and Mn11. The aspect ratio of Mn7 to Mn5 is N:1. The drain of the n-channel transistor Mn9 serves as a current control terminal of the current mirror 230. The source of the n-channel transistor Mn9 is coupled to the drain of the n-channel transistor Mn5. The drain of the n-channel transistor Mn11 serves as a current mirroring terminal of the current mirror 230, which is coupled to the first current path of the switch quad. The source of the n-channel transistor Mn11 is coupled to the drain of the n-channel transistor Mn7. The gates of the n-channel transistor Mn9 and Mn11 are coupled to a DC bias voltage source Vbias. The gates of the n-channel transistors Mn5 and Mn7 are coupled to the output terminal of the operational amplifier OP1. The sources of the n-channel transistors Mn5 and Mn7 are grounded.

Similarly, the current mirror 240 comprises four n-channel transistors Mn6, Mn8, Mn10, and Mn12. The aspect ratio of Mn8 to Mn6 is N:1. The drain of the n-channel transistor Mn10 serves as a current control terminal of the current mirror 240. The source of the n-channel transistor Mn10 is coupled to the drain of the n-channel transistor Mn6. The drain of the n-channel transistor Mn12 serves as a current mirroring terminal of the current mirror 240, which is coupled to the second current path of the switch quad. The source of the n-channel transistor Mn12 is coupled to the drain of the n-channel transistor Mn8. The gates of the n-channel transistor Mn10 and Mn12 are coupled to the DC bias voltage source Vbias. The gates of the n-channel transistors Mn6 and Mn8 are coupled to the output terminal of the operational amplifier OP2. The sources of the n-channel transistors Mn6 and Mn8 are grounded.

The equivalent circuit of the second embodiment in the small signal differential model is the same as the FIG. 10. The resistors r1 and r2 are coupled in series (R/2+R/2=R) between two positive terminals of the operation amplifiers OP1 and OP2. Therefore, the current Ic flowing through the current control terminals of the two current mirrors is given by the equation Ic=(Vin$^+$−Vin$^-$)/R. The current Iin flowing through the current mirroring terminals of the two current mirrors is given by the equation Iin=N(Vin$^+$−Vin$^-$)/R. The linear voltage-current transfer function is achieved in the transconductor 200 of the second embodiment of the present invention.

Figure 12:
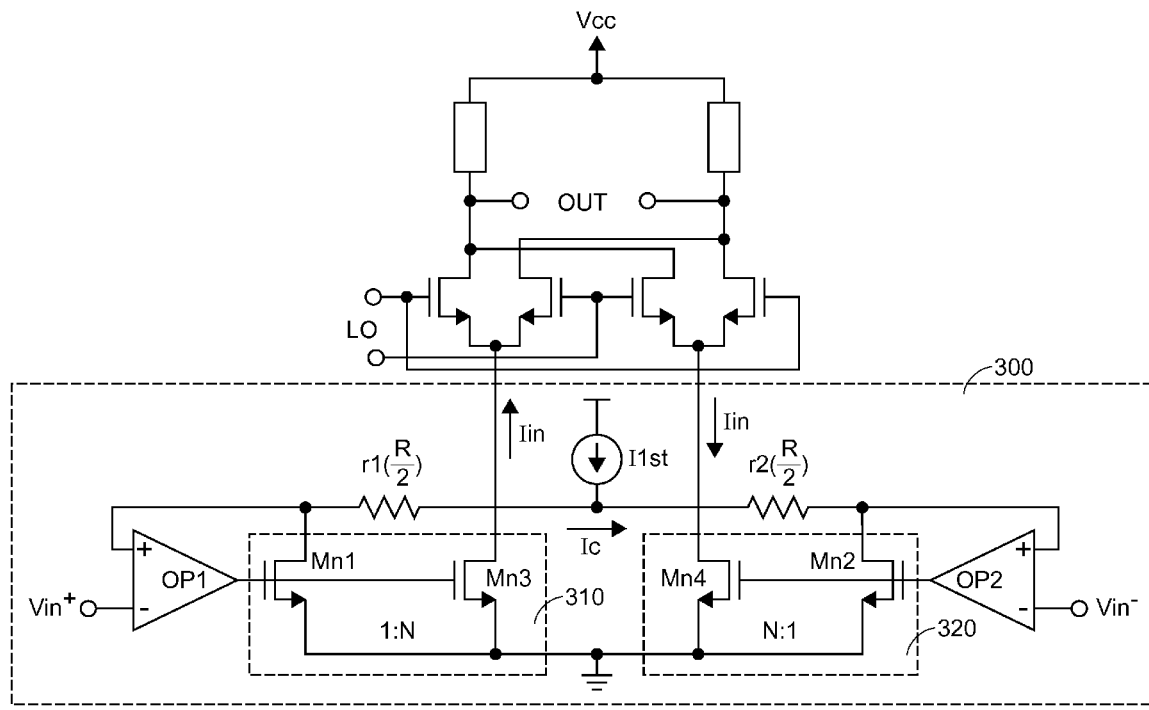
FIG. 12 is a mixer according to the third embodiment of the present invention.

FIG. 12 depicts a mixer according to the third embodiment of the present invention. The main difference between the third embodiment and the first embodiment is the bias current applied to the resistors r1 and r2. The transconductor 300 comprises two resistors r1 (R/2) and r2 (R/2), two operational amplifiers OP1 and OP2, a DC current source I1st, and four n-channel transistors Mn1, Mn2, Mn3, and Mn4. The aspect ratio of Mn3 to Mn1 is N:1 and the aspect ratio of Mn4 to Mn2 is N:1.

The resistor r1 is coupled between a positive input terminal of the operational amplifier OP1 and an output terminal of the current source I1st, and the resistor r2 is coupled between a positive input terminal of the operational amplifier OP2 and the output terminal of the current source I1st. The gates of the n-channel transistors Mn1 and Mn3 are coupled to each other and the n-channel transistors Mn1 and Mn3 operate as a current mirror 310. In the current mirror 310, the drain of the n-channel transistor Mn1 serves as a current control terminal of the current mirror 310. The drain of the n-channel transistor Mn3 serves as a current mirroring terminal of the current mirror 310, which is coupled to the first current path of the switch quad. The sources of the n-channel transistors Mn1 and Mn3 are grounded. The gates of the n-channel transistors Mn2 and Mn4 are coupled to each other and the n-channel transistors Mn2 and Mn4 operate as a current mirror 320. In the current mirror 320, the drain of the n-channel transistor Mn2 serves as a current control terminal of the current mirror 320. The drain of the n-channel transistor Mn4 serves as a current mirroring terminal of the current mirror 320, which is coupled to the second current path of the switch quad. The sources of the n-channel transistors Mn2 and Mn4 are grounded. Moreover, the output terminal of the operational amplifier OP1 is coupled to the gate of the n-channel transistor Mn1, and the output terminal of the operational amplifier OP2 is coupled to the gate of the n-channel transistor Mn2. The voltage signals Vin$^+$ and Vin$^-$ are applied to the negative input terminals of the operational amplifiers OP1 and OP2, respectively.

The equivalent circuit of the third embodiment using the small signal differential model is the same as the FIG. 10. The resistors r1 and r2 are coupled in series (R/2+R/2=R) between the positive terminal of the operational amplifier OP1 and the positive terminal of the operational amplifier OP2. Therefore, the current Ic flowing through the current control terminals of the two current mirrors is given by the equation Ic=(Vin$^+$−Vin$^-$)/R. The current Iin flowing through the current mirroring terminals of the two current mirrors is given by the equation Iin=N(Vin$^+$−Vin$^-$)/R. The linear voltage-current transfer function is achieved in the transconductor 300 of the third embodiment of the present invention.

Figure 13:
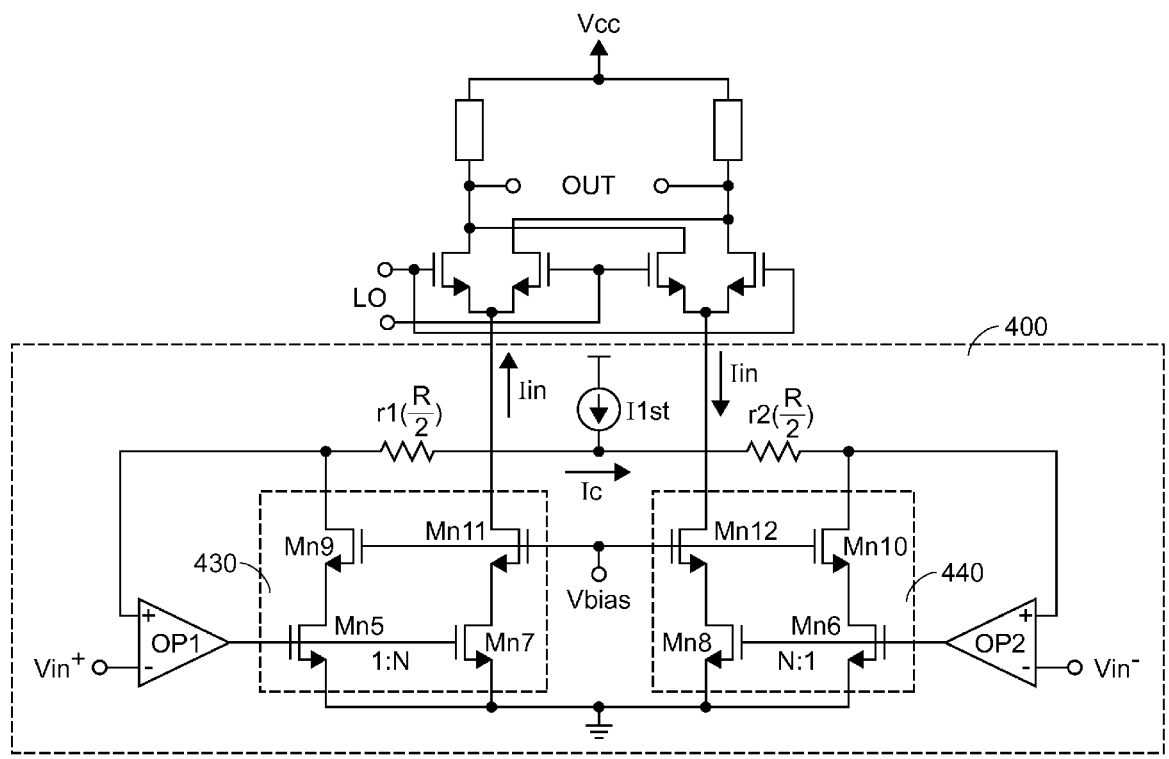
FIG. 13 is a mixer according to the fourth embodiment of the present invention.

FIG. 13 depicts a mixer according to the fourth embodiment of the present invention. The main difference between the fourth embodiment and the third embodiment is the design of the current mirror. Each of the current mirrors 430 and 440 comprises cascade transistors. These cascade transistors provide more precise currents to the current control terminals and the current mirroring terminals of the current mirrors 430 and 440.

The current mirror 430 comprise four n-channel transistors Mn5, Mn7, Mn9, and Mn11. The aspect ratio of Mn7 to Mn5 is N:1. The drain of the n-channel transistor Mn9 serves as a current control terminal of the current mirror 430. The source of the n-channel transistor Mn9 is coupled to the drain of the n-channel transistor Mn5. The drain of the n-channel transistor Mn11 serves as a current mirroring terminal of the current mirror 430, which is coupled to the first current path of the switch quad. The source of the n-channel transistor Mn11 is coupled to the drain of the n-channel transistor Mn7. The gates of the n-channel transistor Mn9 and Mn11 are coupled to the DC bias voltage source Vbias. The gates of the n-channel transistors Mn5 and Mn7 are coupled to the output terminal of the operational amplifier OP1. The sources of the n-channel transistors Mn5 and Mn7 are grounded. The current mirror 440 comprises four n-channel transistors Mn6, Mn8, Mn10, and Mn12. The aspect ratio of Mn8 to Mn6 is N:1. The drain of the n-channel transistor Mn10 serves as a current control terminal of the current mirror 440. The source of the n-channel transistor Mn10 is coupled to the drain of the n-channel transistor Mn6. The drain of the n-channel transistor Mn12 serves as a current mirroring terminal of the current mirror 440, which is coupled to the second current path of the switch quad. The source of the n-channel transistor Mn12 is coupled to the drain of the n-channel transistor Mn8. The gates of the n-channel transistor Mn10 and Mn12 are coupled to the DC bias voltage source Vbias. The gates of the n-channel transistors Mn6 and Mn8 are coupled to the output terminal of the operational amplifier OP2. The sources of the n-channel transistors Mn6 and Mn8 are grounded.

The equivalent circuit of the fourth embodiment in the small signal differential model is the same as the FIG. 10. The resistors r1 and r2 are coupled in series (R/2+R/2=R) between the positive terminal of the operational amplifier OP1 and the positive terminal of the operational amplifier OP2. Therefore, the current Ic flowing through the current control terminals of the two current mirrors is given by the equation Ic=(Vin$^+$−Vin$^-$)/R. The current Iin flowing through the current mirroring terminals of the two current mirrors is given by the equation Iin=N(Vin$^+$−Vin$^-$)/R. The linear voltage-current transfer function is achieved in the transconductor 400 of the fourth embodiment of the present invention.

Figure 14:
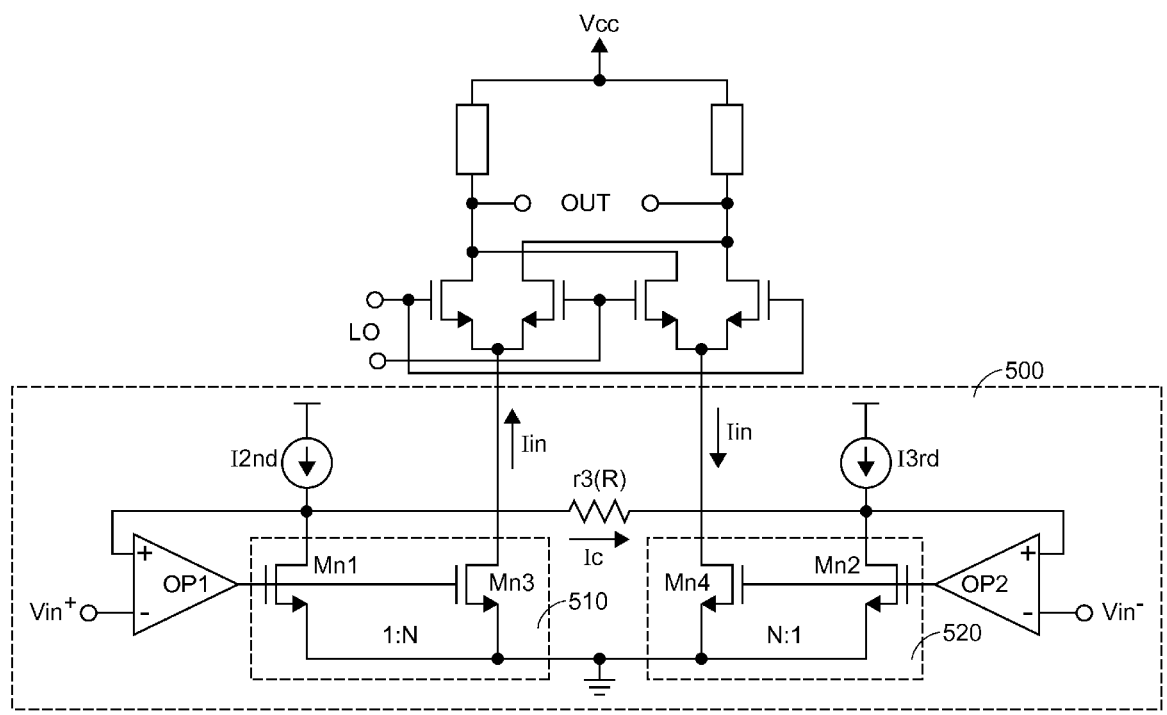
FIG. 14 is a mixer according to the fifth embodiment of the present invention.

FIG. 14 depicts a mixer according to the fifth embodiment of the present invention. The main difference between the fifth embodiment and the first embodiment is the bias currents applied to the resistor r3. The transconductor 500 comprises a resistor r3 having a resistor value of R, two current sources I2nd and I3rd, two operational amplifiers OP1 and OP2, and four n-channel transistors Mn1, Mn2, Mn3, and Mn4. The aspect ratio of Mn3 to Mn1 is N:1 and the aspect ratio of Mn4 to Mn2 is N:1. The resistor r3 is coupled between a positive input terminal of the operational amplifier OP1 and a positive input terminal of the operational amplifier OP2. The output terminal of the current source I2nd is coupled to the positive input terminal of the operational amplifier OP1, and the output terminal of the current source I3rd is coupled to the positive input terminal of the operational amplifier OP2. The gates of the n-channel transistors Mn1 and Mn3 are coupled to each other and the n-channel transistors Mn1 and Mn3 operate as a current mirror 510. In the current mirror 510, the drain of the n-channel transistor Mn1 serves as a current control terminal of the current mirror 510. The drain of the n-channel transistor Mn3 serves as a current mirroring terminal of the current mirror 510, which is coupled to the first current path of the switch quad. The sources of the n-channel transistors Mn1 and Mn3 are grounded. The gates of the n-channel transistors Mn2 and Mn4 are coupled to each other and the n-channel transistors Mn2 and Mn4 operate as a current mirror 520. The drain of the n-channel transistor Mn2 serves as a current control terminal of the current mirror 520. The drain of the n-channel transistor Mn4 serves as a current mirroring terminal of the current mirror 520, which is coupled to the second current path of the switch quad. The sources of the n-channel transistors Mn2 and Mn4 are grounded. Moreover, the output terminal of the operational amplifier OP1 is coupled to the gate of the n-channel transistor Mn1, and the output terminal of the operational amplifier OP2 is coupled to the gate of the n-channel transistor Mn2. The voltage signals $Vin^+$ and $Vin^-$ are applied to the negative input terminals of the operational amplifiers OP1 and OP2, respectively.

The equivalent circuit of the fifth embodiment using a small signal differential model is the same as the FIG. 10. The resistor r3 is coupled between the positive terminal of the operational amplifier OP1 and the positive terminal of the operational amplifier OP2. Therefore, the current Ic flowing through the current control terminals of these two current mirrors is given by the equation $Ic=(Vin^+-Vin^-)/R$. The current Iin flowing through the current mirroring terminals of these two current mirrors is given by the equation $Iin=N*(Vin^+-Vin^-)/R$. The linear voltage-current transfer function can be achieved in the transconductor 500 of the fifth embodiment of the present invention.

Figure 15:
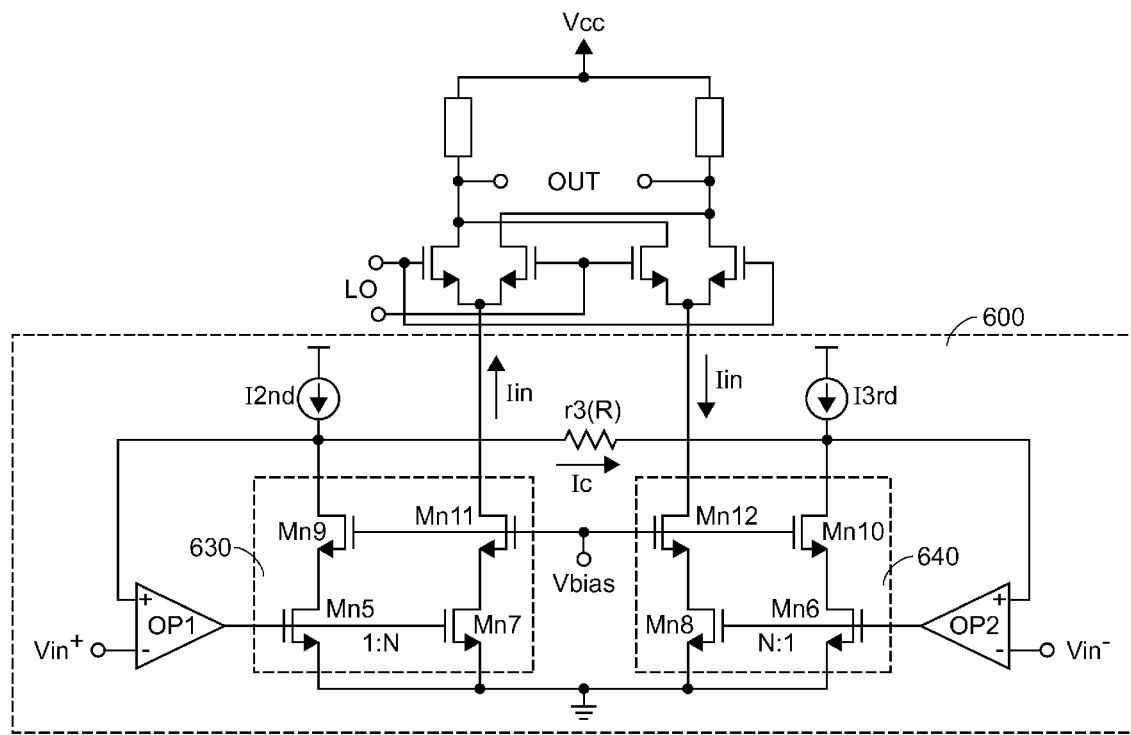
FIG. 15 is a mixer according to the sixth embodiment of the present invention.

FIG. 15 depicts a mixer according to the sixth embodiment of the present invention. The main difference between the sixth embodiment and the fifth embodiment is the circuitry of the current mirror. Each of the current mirrors 630 and 640 comprises cascade transistors. These cascade transistors provide more precise currents to the current control terminals and the current mirroring terminals of the current mirror 630 and the current mirror 640.

The current mirror 630 comprises four n-channel transistors Mn5, Mn7, Mn9, and Mn11. The aspect ratio of Mn7 to Mn5 is N:1. The drain of the n-channel transistor Mn9 serves as a current control terminal of the current mirror 630. The source of the n-channel transistor Mn9 is coupled to the drain of the n-channel transistor Mn5. The drain of the n-channel transistor Mn11 serves as a current mirroring terminal of the current mirror 630, which is coupled to the first current path of the switch quad. The source of the n-channel transistor Mn11 is coupled to the drain of the n-channel transistor Mn7. The gates of the n-channel transistors Mn9 and Mn11 are coupled to the DC bias voltage source (Vbias). The gates of the n-channel transistors Mn5 and Mn7 are coupled to the output terminal of the operational amplifier OP1. The sources of the n-channel transistors Mn5 and Mn7 are grounded. The current mirror 640 comprises four n-channel transistors Mn6, Mn8, Mn10, and Mn12. The aspect ratio of Mn8 to Mn6 is N:1. The drain of the n-channel transistor Mn10 serves as a current control terminal of the current mirror 640. The source of the n-channel transistor Mn10 is coupled to the drain of the n-channel transistor Mn6. The drain of the n-channel transistor Mn12 serves as a current mirroring terminal of the current mirror 640, which is coupled to the second current path of the switch quad. The source of the n-channel transistor Mn12 is coupled to the drain of the n-channel transistor Mn8. The gates of the n-channel transistors Mn10 and Mn12 are coupled to the DC bias voltage source (Vbias). The gates of the n-channel transistors Mn6 and Mn8 are coupled to the output terminal of the operational amplifier OP2. The sources of the n-channel transistors Mn6 and Mn8 are grounded.

The equivalent circuit of the sixth embodiment in a small signal differential model is the same as the FIG. 10. The resistor r3 (R) is coupled between the positive terminals of the operational amplifiers OP1 and OP2. Therefore, the current Ic flowing through the current control terminals of the two current mirrors is given by the equation $Ic=(Vin^+-Vin^-)/R$. The current Iin flowing through the current mirroring terminals of the two current mirrors is given by the equation $Iin=N*(Vin^+-Vin^-)/R$. The linear voltage-current transfer function is achieved in the transconductor 600 in this embodiment.

From the above-mentioned embodiments, the mixers have different DC biasing circuits, but have the same equivalent circuit in the small signal differential model. Furthermore, the linear voltage-current transfer function is achieved in transconductors of all embodiments by using the negative feedback feature of the operational amplifier and using a resistor coupled between the drains of two transistors.

While the invention has been described in terms of what is presently considered to be the most practical and preferred embodiments, it is to be understood that the invention needs not be limited to the disclosed embodiments. On the contrary, it covers various modifications and similar arrangements included within the spirit and scope of the appended claims, which are to be accorded with the broadest interpretation so as to encompass all such modifications and similar structures.

What is claimed is:

1. A mixer is a small signal differential model, comprising:
    a load circuit;
    a switch quad, coupled to the load circuit, including a first current path and a second current path; and
    a transconductor including a first resistor, a first operational amplifier, a second operational amplifier, a first current mirror, and a second current mirror, wherein an output terminal of the first operational amplifier is directly connected to the first current mirror, an output terminal of the second operational amplifier is directly connected to the second current mirror, the first resistor is coupled between a positive input terminal of the first operational amplifier and a positive input terminal of the second operational amplifier, a current control terminal of the first current mirror is directly connected to the positive input terminal of the first operational amplifier, a current mirroring terminal of the first current mirror is coupled to the first current path, a current control terminal of the second current mirror is directly connected to the positive input terminal of the second operational amplifier, a current mirroring terminal of the second current mirror is coupled to the second current path, and a negative input terminal of the first operational amplifier and a negative input terminal of the second operational amplifier are capable of receiving a voltage signal.

2. The mixer according to claim 1, wherein the first current mirror further comprises a first n-channel transistor and a third n-channel transistor; a gate of the first n-channel transistor and a gate of the third n-channel transistor are directly connected to the output terminal of the first operational amplifier, a drain of the first n-channel transistor is served as the current control terminal of the first current mirror, a drain of the third n-channel transistor is served as the current mirroring terminal of the first current mirror, and a source of the first n-channel transistor and a source of the third n-channel transistor are grounded.

3. The mixer according to claim 2, wherein an aspect ratio of the third n-channel transistor to the first n-channel transistor is N:1.

4. The mixer according to claim 1, wherein the second current mirror comprises a second n-channel transistor and a fourth n-channel transistor; a gate of the second n-channel transistor and a gate of the fourth n-channel transistor are directly connected to the output terminal of the second operational amplifier, a drain of the second n-channel transistor is served as the current control terminal of the second current mirror, a drain of the fourth n-channel transistor is served as the current mirroring terminal of the second current mirror, and a source of the second n-channel transistor and a source of the fourth n-channel transistor are grounded.

5. The mixer according to claim 3, wherein an aspect ratio of the fourth n-channel transistor to the second n-channel transistor is N:1.

6. The mixer according to claim 1, wherein the first current mirror comprises a fifth n-channel transistor, a seventh n-channel transistor, a ninth n-channel transistor, and an eleventh n-channel transistor; a drain of the ninth n-channel transistor is served as the current control terminal of the first current mirror, a source of the ninth n-channel transistor is coupled to a drain of the fifth n-channel transistor, a drain of the eleventh n-channel transistor is served as the current mirroring terminal of the first current mirror, a source of the eleventh n-channel transistor is coupled to a drain of the seventh n-channel transistor, a gate of the ninth n-channel transistor and a gate of the eleventh n-channel transistor are coupled to a bias voltage source, a gate of the fifth n-channel transistor and a gate of the seventh n-channel transistor are directly connected to the output terminal of the first operational amplifier, and a source of the fifth n-channel transistor and a source of the seventh n-channel transistor are grounded.

7. The mixer according to claim 1, wherein the second current mirror comprises a sixth n-channel transistor, an eighth n-channel transistor, a tenth n-channel transistor, and a twelfth n-channel transistor; a drain of the tenth n-channel transistor is served as the current control terminal of the second current mirror, a source of the tenth n-channel transistor is coupled to a drain of the sixth n-channel transistor, a drain of the twelfth n-channel transistor is served as the current mirroring terminal of the second current mirror, a source of the twelfth n-channel transistor is coupled to a drain of the eighth n-channel transistor, a gate of the tenth n-channel transistor and a gate of the twelfth n-channel transistor are coupled to a bias voltage source, a gate of the sixth n-channel transistor and a gate of the eighth n-channel transistor are directly connected to the output terminal of the second operational amplifier, and a source of the sixth n-channel transistor and a source of the eighth n-channel transistor are grounded.

8. The mixer according to claim 1, wherein the load circuit comprises a first load and a second load; a first terminal of the first load is coupled to a first terminal of the second load.

9. The mixer according to claim 8, which the switch quad comprises a thirteenth n-channel transistor, a fourteenth n-channel transistor, a fifteenth n-channel transistor, and a sixteenth n-channel transistor; wherein a drain of the thirteenth n-channel transistor and a drain of the fifteenth n-channel transistor are coupled to a second terminal of the first load, a drain of the fourteenth n-channel transistor and a drain of the sixteenth n-channel transistor are coupled to a second terminal of the second load, a gate of the thirteenth n-channel transistor and a gate of the sixteenth n-channel transistor are coupled to each other, a gate of the fourteenth n-channel transistor and a gate of the fifteenth n-channel transistor are coupled to each other, a gate of the thirteenth n-channel transistor and a gate of the fourteenth n-channel transistor receive a local oscillator signal, a source of the thirteenth n-channel transistor and a source of the fourteenth n-channel transistor are coupled together and to be served as the first current path, and a source of the fifteenth n-channel transistor and a source of the sixteenth n-channel transistor are coupled together and to be served as the second current path.

* * * * *